(12) United States Patent
Miyoshi et al.

(10) Patent No.: US 8,946,723 B2
(45) Date of Patent: *Feb. 3, 2015

(54) EPITAXIAL SUBSTRATE AND METHOD FOR MANUFACTURING EPITAXIAL SUBSTRATE

(71) Applicant: NGK Insulators, Ltd., Nagoya-Shi (JP)

(72) Inventors: Makoto Miyoshi, Inazawa (JP); Shigeaki Sumiya, Handa (JP); Mikiya Ichimura, Ichinomiya (JP); Sota Maehara, Nagoya (JP); Mitsuhiro Tanaka, Tsukuba (JP)

(73) Assignee: NGK Insulators, Ltd., Nagoya (JP)

( * ) Notice: Subject to any disclaimer, the term of this patent is extended or adjusted under 35 U.S.C. 154(b) by 98 days.

This patent is subject to a terminal disclaimer.

(21) Appl. No.: 13/658,293

(22) Filed: Oct. 23, 2012

(65) Prior Publication Data
US 2013/0043488 A1  Feb. 21, 2013

Related U.S. Application Data

(63) Continuation of application No. PCT/JP2011/059405, filed on Apr. 15, 2011.

(30) Foreign Application Priority Data

Apr. 28, 2010 (JP) ................................. 2010-103208
Sep. 10, 2010 (JP) ................................. 2010-202981

(51) Int. Cl.
*H01L 31/0256* (2006.01)
*H01L 21/02* (2006.01)
(Continued)

(52) U.S. Cl.
CPC ........ *H01L 21/02381* (2013.01); *C30B 25/183* (2013.01); *C30B 29/403* (2013.01);
(Continued)

(58) Field of Classification Search
USPC ........ 257/76, 190, E29.091, E21.09; 438/478
See application file for complete search history.

(56) References Cited

U.S. PATENT DOCUMENTS 6,255,004 B1    7/2001  Yoshida
8,067,787 B2 *  11/2011 Kokawa et al. ............... 257/190
(Continued)

FOREIGN PATENT DOCUMENTS

CN     1692499 A    11/2005
CN   101207093 A     6/2008
(Continued)

OTHER PUBLICATIONS

Machine translation, Chinese Office Action, SIPO Application No. 201180020582.4, Aug. 25, 2014, all pages.*
(Continued)

*Primary Examiner* — Fernando L Toledo
*Assistant Examiner* — Victoria K Hall
(74) *Attorney, Agent, or Firm* — Burr & Brown, PLLC

(57) ABSTRACT

Provided is a crack-free epitaxial substrate having excellent breakdown voltage properties in which a silicon substrate is used as a base. The epitaxial substrate includes a (111) single crystal Si substrate and a buffer layer including a plurality of first lamination units. Each of those units includes a composition modulation layer formed of a first composition layer made of AlN and a second composition layer made of $Al_xGa_{1-x}N$ being alternately laminated, and a first intermediate layer made of $Al_yGa_{1-y}N$ ($0 \leq y < 1$). The relationship of $x(1) \geq x(2) \geq \ldots \geq x(n-1) \geq x(n)$ and $x(1) > x(n)$ is satisfied, where n represents the number of laminations of each of the first and second composition layers, and $x(i)$ represents the value of x in i-th one of the second composition layers as counted from the base substrate side. The second composition layer is coherent to the first composition layer, and the first intermediate layer is coherent to the composition modulation layer.

16 Claims, 3 Drawing Sheets

(51) Int. Cl.
*C30B 25/18* (2006.01)
*C30B 29/40* (2006.01)
*H01L 29/04* (2006.01)
*H01L 29/15* (2006.01)
*H01L 29/20* (2006.01)
*H01L 29/205* (2006.01)

(52) U.S. Cl.
CPC .... *H01L21/02458* (2013.01); *H01L 21/02494* (2013.01); *H01L 21/02507* (2013.01); *H01L 21/02516* (2013.01); *H01L 21/0254* (2013.01); *H01L 21/02609* (2013.01); *H01L 21/0262* (2013.01); *H01L 29/045* (2013.01); *H01L 29/155* (2013.01); *H01L 29/2003* (2013.01); *H01L 29/205* (2013.01)
USPC .... 257/76; 257/190; 257/E21.09; 257/E29.091; 438/478

(56) References Cited

U.S. PATENT DOCUMENTS

| | | | |
|---|---|---|---|
| 8,264,001 B2* | 9/2012 | Sato | 257/190 |
| 8,338,859 B2* | 12/2012 | Kokawa et al. | 257/190 |
| 8,648,351 B2* | 2/2014 | Miyoshi et al. | 257/76 |
| 8,680,509 B2* | 3/2014 | Ooshika et al. | 257/22 |
| 2003/0057434 A1* | 3/2003 | Hata et al. | 257/103 |
| 2004/0119063 A1* | 6/2004 | Guo et al. | 257/13 |
| 2004/0232440 A1 | 11/2004 | Ohtsuka et al. | |
| 2006/0154455 A1 | 7/2006 | Guo et al. | |
| 2008/0203382 A1* | 8/2008 | Yanagihara | 257/18 |
| 2008/0217645 A1 | 9/2008 | Saxler et al. | |
| 2008/0242060 A1* | 10/2008 | Kosaka et al. | 438/478 |
| 2009/0200645 A1* | 8/2009 | Kokawa et al. | 257/615 |
| 2013/0026486 A1* | 1/2013 | Miyoshi et al. | 257/76 |

FOREIGN PATENT DOCUMENTS

| | | |
|---|---|---|
| EP | 1 343 927 B1 | 4/2007 |
| JP | 10-163528 A1 | 6/1998 |
| JP | 2004-349387 A1 | 12/2004 |
| JP | 2005-350321 A1 | 12/2005 |
| JP | 2006-347786 A1 | 12/2006 |
| JP | 2007-221001 A1 | 8/2007 |
| JP | 2008-251643 A1 | 10/2008 |
| JP | 2009-289956 A1 | 12/2009 |
| WO | 02/48434 A2 | 6/2002 |
| WO | 2004/051707 A2 | 6/2004 |

OTHER PUBLICATIONS

Machine translation, CN 101207093, translation date: Sep. 15, 2014, EPO, all pages.*
Extended European Search Report (Application No. 11774836.8) dated Nov. 5, 2013.
Toshihide Kikkawa, "*Highly Reliable 250 W High Electron Mobility Transistor Power Amplifier*," Japanese Journal of Applied Physics, vol. 44, No. 7A, 2005, pp. 4896-4901.
Nariaki Ikeda, et al., "*High Power AlGaN/GaN HFET with a High Breakdown Voltage of Over 1.8kV on 4 inch Si Substrates and the Suppression of Current Collapse*," Proceedings of the 20th International Symposium on Power Semiconductor Devices & IC's, May 18-22, 2008, p. 287.
International Search Report dated Jul. 12, 2011.
Chinese Office Action, Chinese Application No. 201180020582, dated Aug. 25, 2014 (8 pages).

* cited by examiner

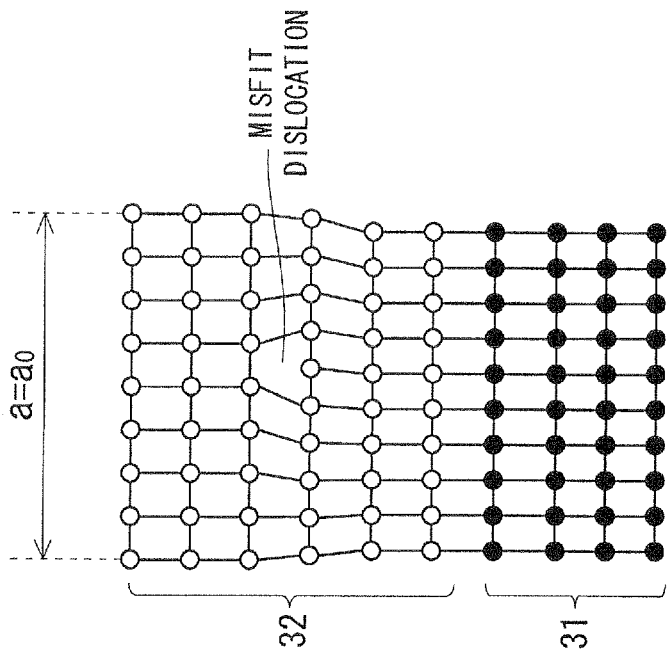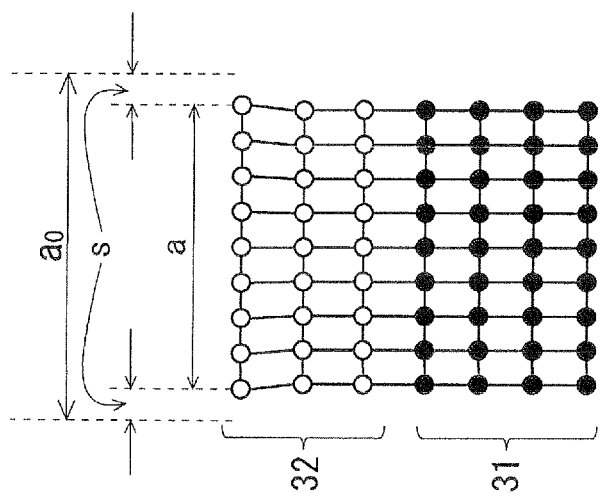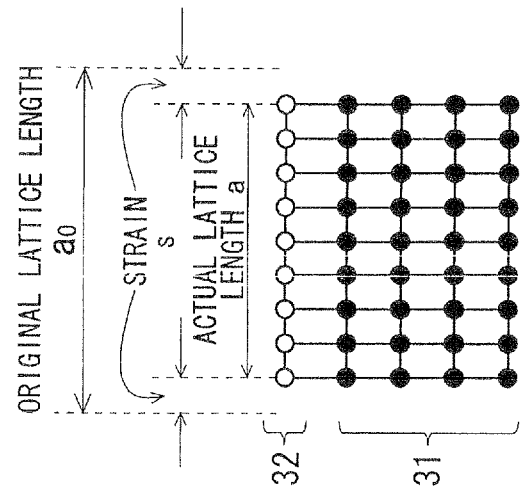

EPITAXIAL SUBSTRATE AND METHOD FOR MANUFACTURING EPITAXIAL SUBSTRATE

BACKGROUND OF THE INVENTION

1. Field of the Invention

The present invention relates to an epitaxial substrate for use in a semiconductor device, and particularly to an epitaxial substrate made of a group-III nitride.

2. Description of Related Art

A nitride semiconductor is attracting attention as a semiconductor material for a light-emitting device such as a LED or a LD and for a high-frequency/high-power electronic device such as a HEMT, because the nitride semiconductor has a wide band gap of direct transition type and the breakdown electric field and the saturation electron velocity thereof are high. For example, a HEMT (high electron mobility transistor) device in which a barrier layer made of AlGaN and a channel layer made of GaN are laminated takes advantage of the feature that causes a high-concentration two-dimensional electron gas (2DEG) to occur in a lamination interface (hetero interface) due to the large polarization effect (a spontaneous polarization effect and a piezo polarization effect) specific to a nitride material (for example, see Non-Patent Document 1).

In some cases, a single crystal (a different kind single crystal) having a composition different from that of a group-III nitride, such as SiC, is used as a base substrate for use in a HEMT-device epitaxial substrate. In this case, a buffer layer such as a strained-superlattice layer or a low-temperature growth buffer layer is generally formed as an initially-grown layer on the base substrate. Accordingly, a configuration in which a barrier layer, a channel layer, and a buffer layer are epitaxially formed on a base substrate is the most basic configuration of the HEMT-device substrate including a base substrate made of a different kind single crystal. Additionally, a spacer layer having a thickness of about 1 nm may be sometimes provided between the barrier layer and the channel layer, for the purpose of facilitating a spatial confinement of the two-dimensional electron gas. The spacer layer is made of, for example, AlN. Moreover, a cap layer made of, for example, an n-type GaN layer or a superlattice layer may be sometimes formed on the barrier layer, for the purpose of controlling the energy level at the most superficial surface of the HEMT-device substrate and improving contact characteristics of contact with an electrode.

The HEMT device and the HEMT-device substrate involve various problems including problems concerning improvement of the performance such as increasing the power density and efficiency, problems concerning improvement of the functionality such as a normally-off operation, fundamental problems concerning a high reliability and cost reduction, and the like. Active efforts are made on each of the problems.

On the other hand, in the preparation of the above-mentioned nitride device, research and development have been made about the use of single crystal silicon for a base substrate for the purpose of reduction of the cost of an epitaxial substrate, furthermore, integration with a silicon-based circuit device, and the like (for example, see Patent Documents 1 to 3, and Non-Patent Document 2). In a case where a conductive material such as silicon is selected for the base substrate of the HEMT-device epitaxial substrate, a field plate effect is applied from a back surface of the base substrate, and therefore a HEMT device can be designed for a high breakdown voltage and high-speed switching.

It is already known that, in order that the HEMT-device epitaxial substrate can be structured with a high breakdown voltage, it is effective to increase the total film thickness of the channel layer and the barrier layer and to improve the electrical breakdown strength of both of the layers (for example, see Non-Patent Document 2).

A method for manufacturing a semiconductor device is also known in which an interposed layer made of AlN is formed on a Si base substrate, then a first semiconductor layer made of GaN and a second semiconductor layer made of AlN are alternately formed so as to cause convex warping as a whole, and then these layers are made contract at a subsequent temperature drop, to result in cancellation of the warping of the entire substrate (for example, see Patent Document 4).

However, it is known that forming a nitride film of good quality on a silicon substrate is very difficult as compared with a case of using a sapphire substrate or a SiC substrate, for the following reasons.

Firstly, the values of the lattice constants of silicon and nitride materials are greatly different from each other. This causes a misfit dislocation at an interface between the silicon substrate and a growth film, and facilitates a three-dimensional growth mode at a timing from the nucleus formation to the growth. In other words, this is a factor that hinders the formation of a good nitride epitaxial film having a low dislocation density and a flat surface.

Additionally, the nitride material has a higher thermal expansion coefficient value than that of silicon. Therefore, in the step of lowering the temperature to the vicinity of the room temperature after a nitride film is epitaxially grown on the silicon substrate at a high temperature, a tensile stress acts in the nitride film. As a result, it is likely that cracking occurs in a film surface and large warping occurs in the substrate.

Moreover, it is also known that trimethylgallium (TMG) that is a material gas of the nitride material for a vapor-phase growth is likely to form a liquid-phase compound with silicon, which is a factor that hinders the epitaxial growth.

In a case where the conventional techniques disclosed in the Patent Documents 1 to 3 and in the Non-Patent Document 1 are adopted, it is possible to cause an epitaxial growth of a GaN film on the silicon substrate. However, the resulting GaN film never has a better crystal quality as compared with a case of using SiC or sapphire for the base substrate. Therefore, preparing an electronic device such as a HEMT using the conventional techniques involves problems of a low electron mobility, a leakage current during the off-time, and a low breakdown voltage.

Furthermore, in the method disclosed in the Patent Document 4, large convex warping is intentionally caused in the course of the device preparation. This may cause cracking in the course of the device preparation, depending on conditions under which the layers are formed.

PRIOR-ART DOCUMENTS

Patent Documents

Patent Document 1: Japanese Patent Application Laid-Open No. 10-163528 (1998)
Patent Document 2: Japanese Patent Application Laid-Open No. 2004-349387
Patent Document 3: Japanese Patent Application Laid-Open No. 2005-350321
Patent Document 4: Japanese Patent Application Laid-Open No. 2009-289956

Non-Patent Documents

Non-Patent Document 1: "Highly Reliable 250 W GaN High Electron Mobility Transistor Power Amplifier", Toshihide Kikkawa, Jpn. J. Appl. Phys. 44, (2005), 4896.

Non-Patent Document 2: "High power AlGaN/GaN HFET with a high breakdown voltage of over 1.8 kV on 4 inch Si substrates and the suppression of current collapse", Nariaki Ikeda, Syuusuke Kaya, Jiang Li, Yoshihiro Sato, Sadahiro Kato, Seikoh Yoshida, Proceedings of the 20th International Symposium on Power Semiconductor Devices & IC's May 18-22, 2008 Orlando, Fla.", pp. 287-290

SUMMARY OF THE INVENTION

The present invention has been made in view of the problems described above, and an object of the present invention is to provide an epitaxial substrate having excellent breakdown voltage properties in which a silicon substrate is used as a base substrate.

To solve the problems described above, a first aspect of the present invention is an epitaxial substrate in which a group of group-III nitride layers are formed on a base substrate made of (111)-oriented single crystal silicon such that a (0001) crystal plane of the group of group-III nitride layers is substantially in parallel with a substrate surface of the base substrate. The epitaxial substrate includes: a buffer layer including a plurality of first lamination units each including a composition modulation layer and a first intermediate layer, the composition modulation layer being formed of a first composition layer made of AlN and a second composition layer made of a group-III nitride having a composition of $Al_xGa_{1-x}N$ (0≤x≤1) being alternately laminated, the first intermediate layer being made of a group-III nitride having a composition of $Al_yGa_{1-y}N$ (0≤y<1); and a crystal layer formed on the buffer layer. Each of the composition modulation layers is formed so as to satisfy the relationship of: x(1)≥x(2)≥ . . . ≥x(n−1)≥x(n) and x(1)>x(n), where n represents the number of laminations of each of the first composition layer and the second composition layer (n is a natural number equal to or greater than two), and x(i) represents the value of x in i-th one of the second composition layers as counted from the base substrate side. In each of the composition modulation layers, each of the second composition layers is formed so as to be in a coherent state relative to the first composition layer. The first intermediate layer is formed so as to be in a coherent state relative to the composition modulation layer.

In a second aspect of the present invention, in the epitaxial substrate according to the first aspect, the buffer layer is formed of the first lamination unit and a second lamination unit being alternately laminated; and the second lamination unit is a substantially strain-free intermediate layer made of AlN and formed with a thickness of 10 nm or more and 150 nm or less.

In a third aspect of the present invention, in the epitaxial substrate according to the first or second aspect, the first intermediate layer is made of a group-III nitride having a composition of $Al_yGa_{1-y}N$ (0.25≤y≤0.4).

In a fourth aspect of the present invention, in the epitaxial substrate according to the first or second aspect, a termination layer having the same composition as that of the first composition layer is provided in an uppermost portion of the composition modulation layer.

In a fifth aspect of the present invention, in the epitaxial substrate according to the fourth aspect, the thickness of the termination layer is greater than the thickness of the first composition layer.

In a sixth aspect of the present invention, the epitaxial substrate according to any of the first to fifth aspects further includes: a first base layer made of AlN and formed on the base substrate; and a second base layer made of $Al_pGa_{1-p}N$ (0≤p≤1) and formed on the first base layer. The first base layer is a layer with many crystal defects configured of at least one kind from a columnar or granular crystal or domain. An interface between the first base layer and the second base layer defines a three-dimensional concavo-convex surface. The buffer layer is formed immediately on the second base layer.

A seventh aspect of the present invention is a method for manufacturing an epitaxial substrate for use in a semiconductor device, the epitaxial substrate having a group of group-III nitride layers formed on a base substrate made of (111)-oriented single crystal silicon such that a (0001) crystal plane of the group of group-III nitride layers is substantially in parallel with a substrate surface of the base substrate. The method includes: a buffer layer formation step for forming a buffer layer including a plurality of first lamination units each including a composition modulation layer and a first intermediate layer by performing a composition modulation layer formation step and a first intermediate layer formation step a plurality of times, the composition modulation layer formation step being a step for forming the composition modulation layer by alternately laminating a first composition layer made of AlN and a second composition layer made of a group-III nitride having a composition of AlxGa1-xN (0≤x>1), the first intermediate layer formation step being a step for forming the first intermediate layer made of a group-III nitride having a composition of $Al_yGa_{1-y}N$ (0≤y<1); and a crystal layer formation step for forming a crystal layer above the buffer layer, the crystal layer being made of group-III nitride. In the composition modulation layer formation step, the composition modulation Layer is formed in such a manner that: the relationship of x(1)≥x(2)≥ . . . ≥x(n−1)≥x(n) and x(1)>x(n) is satisfied, where n represents the number of laminations of each of the first composition layer and the second composition layer (n is a natural number equal to or greater than two), and x(i) represents the value of x in i-th one of the second composition layers as counted from the base substrate side; and each of the second composition layers is in a coherent state relative to the first composition layer. In the first intermediate layer formation step, the first intermediate layer is formed so as to be in a coherent state relative to the composition modulation layer.

In an eighth aspect of the present invention, in the method for manufacturing the epitaxial substrate according to the seventh aspect, the buffer layer formation step is a step for forming the buffer layer in which the first lamination unit and a second lamination unit are alternately laminated, by alternately performing a first lamination unit formation step for forming the first lamination unit and a second lamination unit formation step for forming second lamination unit; and in the second lamination unit formation step, an intermediate layer made of AlN with a thickness of 10 nm or more and 150 nm or less is formed as the second lamination unit.

In a ninth aspect of the present invention, in the method for manufacturing the epitaxial substrate according to the seventh or eighth aspect, in the first intermediate layer formation step, the first intermediate layer is formed of a group-III nitride having a composition of $Al_yGa_{1-y}N$ (0.25≤y≤0.4).

In a tenth aspect of the present invention, in the method for manufacturing the epitaxial substrate according to the seventh or eighth aspect, the first lamination unit formation step includes a termination layer formation step for forming a termination layer having the same composition as that of the first composition layer in an uppermost portion of the composition modulation layer, and the first intermediate layer is formed on the termination layer.

In an eleventh aspect of the present invention, in the method for manufacturing the epitaxial substrate according to the tenth aspect, in the termination layer formation step, the termination layer is formed thicker than the first composition layer.

In a twelfth aspect of the present invention, the method for manufacturing the epitaxial substrate according to any of the seventh to eleventh aspects further includes: a first base layer formation step for forming a first base layer on the base substrate, the first base layer being made of AlN; and a second base layer formation step for forming a second base layer on the first base layer, the second base layer being made of $Al_pGa_{1-p}N$ ($0 \leq p \leq 1$). In the first base layer formation step, the first base layer is formed as a layer with many crystal defects configured of at least one kind from a columnar or granular crystal or domain, such that a surface thereof is a three-dimensional concavo-convex surface. In the buffer layer formation step, the buffer layer is formed immediately on the second base layer.

In the first to twelfth aspects of the present invention, an epitaxial substrate having a high breakdown voltage is achieved while a silicon substrate, which is easily available in a large diameter at a low cost, is adopted as a base substrate thereof.

Particularly, in the second and eighth aspects, providing the second lamination unit serving as a second intermediate layer causes a large compressive strain to exist in the buffer layer. Accordingly, a tensile stress caused by a difference in a thermal expansion coefficient between silicon and a group-III nitride is cancelled by the compressive strain. Therefore, a crack-free epitaxial substrate having a small amount of warping and an excellent crystal quality can be obtained even when a silicon substrate is used as the base substrate.

Particularly, in the fifth and eleventh aspects, an epitaxial substrate in which the warping is further reduced is achieved.

Particularly, in the sixth and twelfth aspects, the buffer layer is provided on the base layer having a low dislocation and an excellent surface flatness. Accordingly, the buffer layer, the crystal layer, and the like, have good crystal quality. On the other hand, an accumulation of strain energy in the second base layer is suppressed. Therefore, the effect of canceling the tensile stress exerted by the compressive strain existing in the buffer layer is not hindered by any accumulation of strain energy in the base layer.

BRIEF DESCRIPTION OF THE DRAWINGS

FIGS. 2A, 2B, and 2C are model diagrams showing a crystal lattice at a time when a second composition layer 32 is formed on a first composition layer 31 in a composition modulation layer 3.

DETAILED DESCRIPTION OF THE INVENTION

<Outline Configuration of Epitaxial Substrate>

Figure 1:
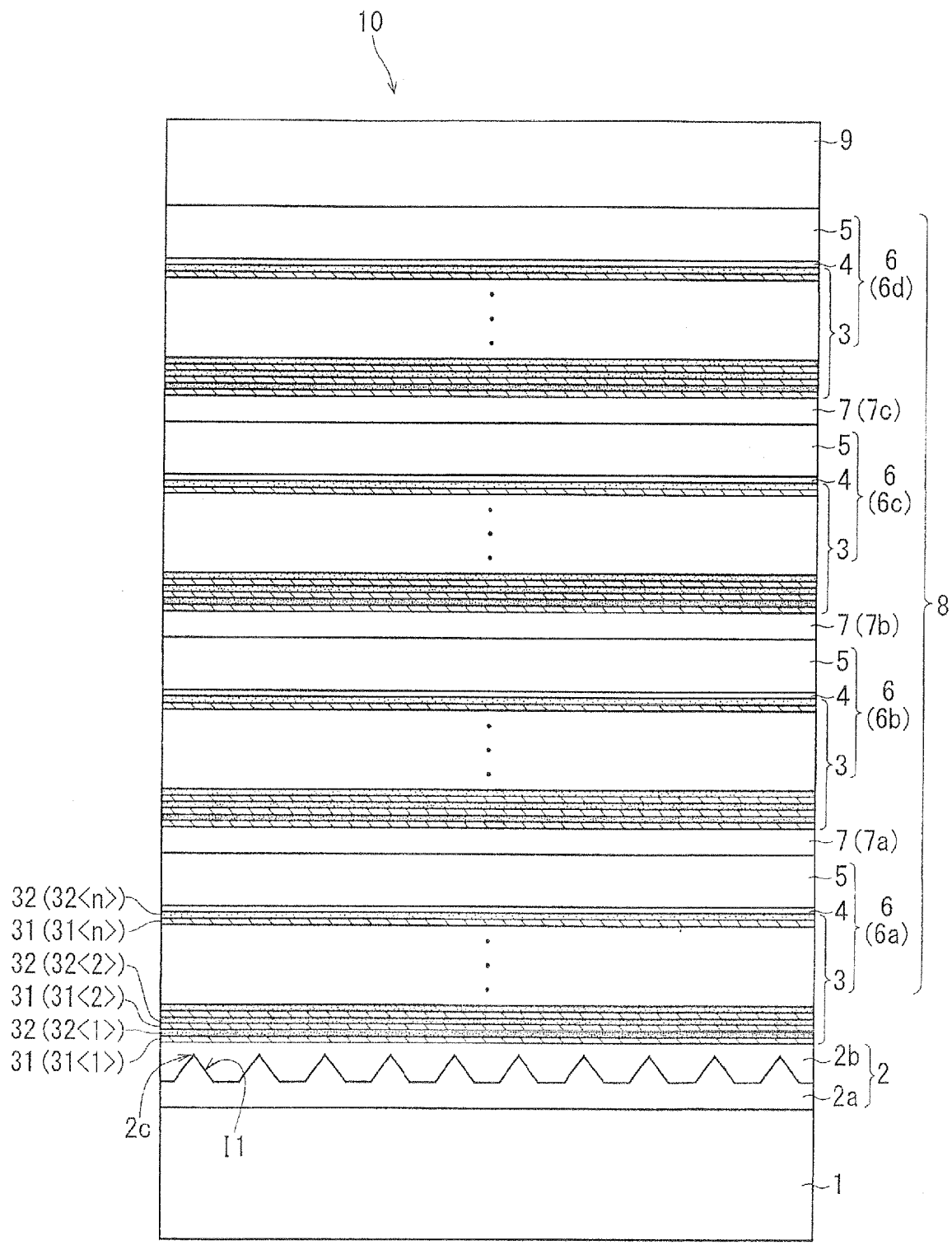
FIG. 1 is a schematic cross-sectional view showing an outline configuration of an epitaxial substrate 10 according to an embodiment of the present invention.

FIG. 1 is a schematic cross-sectional view showing an outline configuration of an epitaxial substrate 10 according to an embodiment of the present invention.

The epitaxial substrate 10 mainly includes a base substrate 1, a base layer 2, a buffer layer 8, and a function layer 9. The buffer layer 8 includes a plurality of composition modulation layers 3, a plurality of termination layers 4, a plurality of first intermediate layers 5, and a plurality of second intermediate layers 7. In the following, the layers formed on the base substrate 1 will be sometimes collectively referred to as an epitaxial film. Here for convenience of the description, the proportion of existence of Al in the group-III elements will be sometimes referred to as Al mole fraction.

The base substrate 1 is a wafer of (111) plane single crystal silicon having the p-type conductivity. The thickness of the base substrate 1 is not particularly limited, but for convenience of handling, it is preferable to use the base substrate 1 having a thickness of several hundred μm to several mm.

Each of the base layer 2, the composition modulation layer 3, the termination layer 4, the first intermediate layer 5, the second intermediate layer 7, and the function layer 9 is a layer formed of a wurtzite-type group-III nitride by using an epitaxial growth method such that a its (0001) crystal plane can be substantially in parallel with a substrate surface of the base substrate 1. In a preferred example, these layers are formed by a metalorganic chemical vapor deposition method (MOCVD method).

The base layer 2 is a layer provided for the purpose of enabling each of the above-mentioned layers to be formed thereon with a good crystal quality. To be specific, the base layer 2 is formed in such a manner that its dislocation density is suitably reduced and it has a good crystal quality at least near its surface (near an interface with the composition modulation layer 3). As a result, a good crystal quality is obtained in the composition modulation layer 3, and additionally in the layers formed thereon.

In this embodiment, to satisfy the purpose, the base layer 2 is composed of a first base layer 2a and a second base layer 2b, as described below.

The first base layer 2a is a layer made of AlN. The first base layer 2a is a layer configured of a large number of small columnar crystals or the like (at least one kind from columnar crystals, granular crystals, columnar domains, and granular domains) that have been grown in a direction (film formation direction) substantially perpendicular to the substrate surface of the base substrate 1. In other words, the first base layer 2a is a layer with many defects having inferior crystal properties, in which, although uniaxial orientation is achieved along a lamination direction of the epitaxial substrate 10, many crystal grain boundaries or dislocations exist along the lamination direction. In this embodiment, for convenience of the description, the crystal grain boundary is sometimes used as the term inclusive of domain grain boundaries and dislocations, too. In the first base layer 2a, the interval of the crystal grain boundaries is at most about several tens nm.

The first base layer 2a having this configuration is formed such that the half width of a (0002) X-ray rocking curve can be 0.5 degrees or more and 1.1 degrees or less and such that the half width of a (10-10) X-ray rocking curve can be 0.8 degrees or more and 1.1 degrees or less. The half width of the (0002) X-ray rocking curve serves as an index of the magnitude of mosaicity of a c-axis tilt component or the frequency of screw dislocations. The half width of the (10-10) X-ray rocking curve serves as an index of the magnitude of mosaicity of a crystal rotation component whose rotation axis is c-axis or the frequency of edge dislocations.

On the other hand, the second base layer 2b is a layer formed on the first base layer 2a and made of a group-III nitride having a composition of $Al_pGa_{1-p}N$ ($0 \leq p \leq 1$).

An interface 11 (a surface of the first base layer 2a) between the first base layer 2a and the second base layer 2b is a three-dimensional concavo-convex surface that reflects the outer shapes of the columnar crystals and the like included in the first base layer 2a. The fact that the interface 11 has such a shape is clearly confirmed in, for example, a HAADF (high-angle annular dark-field) image of the epitaxial substrate 10. The HAADF image is obtained by a scanning transmission electron microscope (STEM), and is a mapping image of the integrated intensity of electron that is inelastically scattered at a high angle. In the HAADF image, the image intensity is proportional to the square of an atomic number, and a portion where an atom having a greater atomic number exists is observed more brightly (more white). Therefore, the second base layer 2b containing Ga is observed relatively bright, and the first base layer 2a not containing Ga is observed relatively dark. Thereby, the fact that the interface I1 therebetween is configured as a three-dimensional concavo-convex surface is easily recognized.

In the schematic cross-section of FIG. 1, convex portions 2c of the first base layer 2a are located at substantially regular intervals. This is merely for convenience of illustration. Actually, the convex portions 2c are not necessarily located at regular intervals. Preferably, the first base layer 2a is formed such that the density of the convex portions 2c can be $5 \times 10^9/\text{cm}^2$ or more and $5 \times 10^{10}/\text{cm}^2$ or less and the average interval of the convex portions 2c can be 45 nm or more and 140 nm or less. When these ranges are satisfied, the function layer 9 having, particularly, an excellent crystal quality can be formed. In this embodiment, the convex portion 2c of the first base layer 2a always denotes a position substantially at the apex of an upward convex portion of the surface (interface I1). From the results of experiments and observations made by the inventors of the present invention, it has been confirmed that a side wall of the convex portion 2c is formed by a (10-11) plane or (10-12) plane of AlN.

In order that the convex portions 2c that satisfy the above-mentioned density and average interval can be formed on the surface of the first base layer 2a, it is preferable to form the first base layer 2a with an average film thickness of 40 nm or more and 200 inn or less. In a case where the average film thickness is less than 40 nm, it is difficult to achieve a state where the substrate surface is thoroughly covered with AlN while forming the convex portions 2c as described above. On the other hand, when the average film thickness exceeds 200 nm, flattening of an AlN surface starts to progress, to make it difficult to form the convex portions 2c described above.

The formation of the first base layer 2a is performed under predetermined epitaxial growth conditions. Here, forming the first base layer 2a with AlN is preferable in terms of not containing Ga which forms a liquid-phase compound with silicon and in terms of easily configuring the interface 11 as a three-dimensional concavo-convex surface because a horizontal growth is relatively unlikely to progress.

In the epitaxial substrate 10, the first base layer 2a that is a layer with many defects in which the crystal grain boundaries exist is interposed between the base substrate 1 and the second base layer 2b in the above-described manner. This relieves a lattice misfit between the base substrate 1 and the second base layer 2b, and thus an accumulation of strain energy caused by this lattice misfit is suppressed. The above-described ranges of the half widths of the (0002) and (10-10) X-ray rocking curves with respect to the first base layer 2a are set as ranges that can suitably suppress the accumulation of strain energy due to the crystal grain boundaries.

However, the interposition of the first base layer 2a causes an enormous number of dislocations originating from the crystal grain boundaries such as the columnar crystals of the first base layer 2a to propagate in the second base layer 2b. In this embodiment, as described above, the interface I1 between the first base layer 2a and the second base layer 2b is configured as a three-dimensional concavo-convex surface, and thereby such dislocations are effectively reduced.

Since the interface I1 between the first base layer 2a and the second base layer 2b is configured as a three-dimensional concavo-convex surface, most of the dislocations caused in the first base layer 2a are bent at the interface I1 during the propagation (penetration) from the first base layer 2a to the second base layer 2b, and coalesce and disappear within the second base layer 2b. As a result, only a small part of the dislocations originating from the first base layer 2a penetrates through the second base layer 2b.

Preferably, although the second base layer 2b is formed along the shape of the surface of the first base layer 2a (the shape of the interface I1) in an initial stage of the growth, the surface thereof is gradually flattened along with the progress of the growth, and finally obtains a surface roughness of 10 nm or less. In this embodiment, the surface roughness is expressed as an average roughness ra in a region of 5 μm×5 μm which has been measured by an AFM (atomic force microscope). Here, in terms of obtaining a good surface flatness of the second base layer 2b, it is preferable that the second base layer 2b is formed of a group-III nitride having a composition that contains at least Ga, which allows a horizontal growth to progress relatively easily.

It is preferable that the second base layer 2b has an average thickness of 40 nm or more. This is because, when the average thickness is less than 40 nm, such problems arise that concaves and convexes caused by the first base layer 2a cannot sufficiently be flattened, and that the disappearance of dislocations having propagated to the second base layer 2b and coalesced with each other does not sufficiently occur. In a case where the average thickness is 40 nm or more, the reduction of the dislocation density and the flattening of the surface are effectively achieved. Therefore, in a technical sense, no particular limitation is put on an upper limit of the thickness of the second base layer 2b, but from the viewpoint of the productivity, it is preferable that the thickness is about several μm or less.

As described above, the surface of the second base layer 2b has a low dislocation and an excellent flatness, and therefore the layers formed thereon have a good crystal quality.

The buffer layer 8 includes at least a plurality of unit structures 6 each formed of the composition modulation layer 3, the termination layer 4, and the first intermediate layer 5 being laminated in the mentioned order. Preferably, as shown in FIG. 1, the buffer layer 8 is configured such that the second intermediate layer 7 is interposed between the unit structures 6. In this case, the second intermediate layer 7 is provided as a boundary layer between the respective unit structures 6. Alternatively, in still other words, the buffer layer 8 has a configuration in which the uppermost and lowermost portions thereof are the unit structures 6, and the unit structure 6 serving as a first lamination unit and the second intermediate layer 7 serving as a second lamination unit are alternately and repeatedly laminated. Although FIG. 1 illustrates a case where there are four unit structures 6 (6a, 6b, 6c, 6d) and three second intermediate layers 7 (7a, 7b, 7c), the numbers of the unit structures 6 and the second intermediate layers 7 are not limited thereto and it suffices that the number of laminations of the composition modulation layer 3 is about 3 to 6.

The composition modulation layer 3 is a part formed by a first composition layer 31 made of AlN and a second composition layer 32 made of a group-III nitride having a composition of $Al_xGa_{1-x}N$ ($0 \leq x \leq 1$) being alternately laminated. In this embodiment, the i-th first composition layer 31 as counted from the base substrate 1 side is expressed as "31<i>", and the i-th second composition layer 32 as counted from the base substrate 1 side is expressed as "32<i>".

The second composition layer 32 is formed so as to satisfy the following expressions 1 and 2, where n (n is a natural number equal to or greater than two) represents the number of the first composition layers 31 and the number of the second composition layers 32, and x(i) represents the Al mole fraction x in the second composition layer 32 with respect to the i-th second composition layer 32<i> as counted from the base substrate 1 side.

$$x(1) \geq x(2) \geq \ldots \geq x(n-1) \geq x(n) \quad \text{(Expression 1)}$$

$$x(1) > x(n) \quad \text{(Expression 2)}$$

That is, the composition modulation layer 3 has a configuration in which the Al mole fraction is lower in the second composition layer 32<n> than in the second composition layer 32<1> and, at least partially, the Al mole fraction x in the second composition layer 32 gradually decreases as the second composition layer 32 is more distant from the base substrate 1. It is more preferable to satisfy the relationship of x(1)≥0.8 and x(n)≤0.2.

The expressions 1 and 2 are satisfied typically by forming the composition modulation layer 3 in such a manner that the second composition layer 32 more distant from the base substrate 1 has a lower Al mole fraction (that is, being richer in Ga). Therefore, hereinafter, in this embodiment, it is assumed that the second composition layer 32 more distant from the base substrate 1 has a lower Al mole fraction, including a case where there exist a second composition layer 32<i−1> and a second composition layer 32<i> having the same Al mole fraction x. Here, forming the second composition layer 32 in such a manner is also expressed as giving a compositional grading to the second composition layer 32.

Since the first composition layer 31 is made of AlN and the second composition layer 32 is made of a group-III nitride having a composition of $Al_xGa_{1-x}N$, the first composition layer 31 and the second composition layer 32 are formed so as to satisfy such a relationship that an in-plane lattice constant (lattice length) under a strain-free state (bulk state) is greater in the group-III nitride ($Al_xGa_{1-x}N$) of the latter than in the group-III nitride (AlN) of the former.

Additionally, in the composition modulation layer 3, the second composition layer 32 is formed so as to be coherent to the first composition layer 31.

It is preferable that each first composition layer 31 is formed with a thickness of about 3 nm to 20 nm, and typically 5 nm to 10 nm. On the other hand, it is preferable that the second composition layer 32 is formed with a thickness of about 10 nm to 25 nm, and typically 15 nm to 35 nm. The value of n is about 10 to 40.

The termination layer 4 is a layer made of a group-III nitride having the same composition as that of the first composition layer 31 and formed on an uppermost portion (terminating portion) of the composition modulation layer 3. The termination layer 4 is formed with a thickness equal to or greater than the thickness of the first composition layer 31. Additionally, the termination layer 4 is formed with a thickness in a range that allows the first intermediate layer 5 to be formed thereon in a coherent state. To be specific, it is preferable that the termination layer 4 is formed with a thickness of about 3 to 100 nm. Typically, the termination layer 4 is formed with a thickness of 5 to 70 nm.

More preferably, the termination layer 4 is formed with a thickness greater than the thickness of the first composition layer 31. To be specific, the termination layer 4 is formed with a thickness of 30 to 70 nm.

The first intermediate layer 5 is a layer made of a group-III nitride having a composition of $Al_yGa_{1-y}N$ (0≤y<1). The first intermediate layer 5 is made of a group-III nitride whose in-plane lattice constant under a strain-free state is greater than that of the group-III nitride of the first composition layer 31 and the termination layer 4. Preferably, the first intermediate layer 5 is made of a group-III nitride having a composition of $Al_yGa_{1-y}N$ (0.25≤y≤0.4). The first intermediate layer 5 is formed so as to be coherent to the termination layer 4. It is preferable that the first intermediate layer 5 has a thickness of roughly 100 nm or more and 500 nm or less. It is more preferable that the first intermediate layer 5 is formed with a thickness of 100 nm or more and 300 nm or less.

The second intermediate layer 7 is a layer made of a group-III nitride whose in-plane lattice constant under a strain-free state is smaller than that of the group-III nitride of the first intermediate layer 5. Preferably, the second intermediate layer 7 is made of the same composition (that is, AlN) as that of the first composition layer 31 of the composition modulation layer 3. The second intermediate layer 7 is not an essential component part for the achievement of an increased breakdown voltage of the epitaxial substrate 10, as will be described later. It is preferable that the second intermediate layer 7 is formed with a thickness of roughly 10 nm or more and 150 nm or less.

The function layer 9 is at least one layer made of a group-III nitride and formed on the buffer layer 8. The function layer 9 is a layer that develops a predetermined function in a situation where predetermined semiconductor layers, electrodes, and the like, are additionally provided on the epitaxial substrate 10 to thereby form a semiconductor device. Accordingly, the function layer 9 is constituted of one or more layers having a composition and a thickness appropriate for this function. Although FIG. 1 illustrates a case where the function layer 9 is constituted of a single layer, the configuration of the function layer 9 is not limited thereto.

For example, a channel layer made of high-resistivity GaN and having a thickness of several μm and a barrier layer made of AlGaN, InAlN, or the like and having a thickness of several tens nm are laminated to serve as the function layer 9, and thereby the epitaxial substrate 10 for a HEMT device is obtained. That is, a HEMT device is obtained by forming a gate electrode, a source electrode, and a drain electrode on the barrier layer, though not shown. For forming these electrodes, a known technique such as a photolithography process is applicable. In such a case, a spacer layer made of AlN and having a thickness of about 1 nm may be provided between the channel layer and the barrier layer.

Alternatively, a concentric Schottky diode is achieved by forming one group-III nitride layer (for example, a GaN layer) as the function layer 9 and forming an anode and a cathode thereon, though not shown. For forming these electrodes, the known technique such as the photolithography process is also applicable.

<Method for Manufacturing Epitaxial Substrate>

Next, a method for manufacturing the epitaxial substrate 10 will be generally described while a case of using the MOCVD method is taken as an example.

Firstly, a (111) plane single crystal silicon wafer is prepared as the base substrate 1. A natural oxide film is removed by dilute hydrofluoric acid cleaning. Then, SPM cleaning is performed to create a state where an oxide film having a thickness of about several Å is formed on a wafer surface. This is set within a reactor of a MOCVD apparatus.

Then, each layer is formed under predetermined heating conditions and a predetermined gas atmosphere. Firstly, for the first base layer 2a made of AlN, a substrate temperature is maintained at a predetermined initial layer formation temperature of 800° C. or higher and 1200° C. or lower, and the pressure in the reactor is set to be about 0.1 to 30 kPa. In this state, a TMA (trimethylaluminum) bubbling gas that is an aluminum raw material and a $NH_3$ gas are introduced into the reactor with an appropriate molar flow ratio. A film formation speed is set to be 20 nm/min or higher, and a target film thickness is set to be 200 nm or less. Thereby, the formation of the first base layer 2a is achieved.

For the formation of the second base layer 2b, after the formation of the first base layer 2a, a substrate temperature is maintained at a predetermined second base layer formation temperature of 800° C. or higher and 1200° C. or lower, and the pressure in the reactor is set to be 0.1 to 100 kPa. In this state, a TMG (trimethylgallium) bubbling gas that is a gallium raw material, a TMA bubbling gas, and a $NH_3$ gas are introduced into the reactor with a predetermined flow ratio that is appropriate for a composition of the second base layer 2b to be prepared. Thus, $NH_3$ is reacted with TMA and TMG. Thereby, the formation of the second base layer 2b is achieved.

For the formation of the respective layers included in the buffer layer 8, that is, for the formation of the first composition layer 31 and the second composition layer 32 included in the composition modulation layer 3, the termination layer 4, the first intermediate layer 5, and the second intermediate layer 7, subsequent to the formation of the second base layer 2b, a substrate temperature is maintained at a predetermined formation temperature of 800° C. or higher and 1200° C. or lower that is appropriate for each of the layers, and the pressure in the reactor is maintained at a predetermined value of 0.1 to 100 kPa that is appropriate for each of the layers. In this state, a $NH_3$ gas and a group-III nitride material gas (TMA and TMG bubbling gases) are introduced into the reactor with a flow ratio that is appropriate for a composition to be achieved in each of the layers. Thereby, the formation of the respective layers is achieved. At this time, by changing the flow ratio at a timing appropriate for a set film thickness, the respective layers are formed in a continuous manner and with desired film thicknesses.

For the formation of the function layer 9, after the formation of the buffer layer 8, a substrate temperature is maintained at a predetermined function layer formation temperature of 800° C. or higher and 1200° C. or lower, and the pressure in the reactor is set to be 0.1 to 100 kPa. In this state, at least one of a TMI bubbling gas, a TMA bubbling gas, and a TMG bubbling gas, and a $NH_3$ gas are introduced into the reactor with a flow ratio that is appropriate for a composition of the function layer 9 to be prepared. Thus, $NH_3$ is reacted with at least one of TMI, TMA, and TMG. Thereby, the formation of the function layer 9 is achieved.

After the function layer 9 is formed, in the reactor, the temperature of the epitaxial substrate 10 is lowered to an ordinary temperature. Then, the epitaxial substrate 10 is taken out from the reactor and subjected to an appropriate subsequent process (such as patterning of an electrode layer).

<Functions and Effects of Buffer Layer>

Generally, as is the case for this embodiment as well, in a case of preparing an epitaxial substrate by causing a crystal layer made of a group-III nitride to epitaxially grow on a single crystal silicon wafer at a predetermined formation temperature, a tensile stress in an in-plane direction occurs in the crystal layer in the course of lowering the temperature to the ordinary temperature after the crystal growth, because the group-III nitride has a thermal expansion coefficient greater than that of silicon (for example, silicon: $3.4 \times 10^{-6}$/K, GaN: $5.5 \times 10^{-6}$/K). This tensile stress is a factor that causes occurrence of cracking and warping in the epitaxial substrate. In this embodiment, the buffer layer 8 is provided in the epitaxial substrate 10 for the purpose of reducing the tensile stress and suppressing occurrence of cracking and warping. More specifically, due to functions and effects exerted by each of the layers included in the buffer layer 8, occurrence of cracking and warping in the epitaxial substrate 10 are suppressed. In the following, a detailed description will be given.

(Composition Modulation Layer)

FIG. 2 is a model diagram showing a crystal lattice at a time when the second composition layer 32 is formed on the first composition layer 31 in the composition modulation layer 3. Here, the lattice length, in the in-plane direction, of $Al_xGa_{1-x}N$ of the second composition layer 32 under the strain-free state is defined as $a_0$, and the actual lattice length thereof is defined as a. In this embodiment, as shown in FIGS. 2A and 2B, a crystal growth progresses in the second composition layer 32 while keeping aligned with the crystal lattice of the first composition layer 31. This means that a compressive strain of $s=a_0-a$ occurs in the in-plane direction of the second composition layer 32 during the crystal growth. That is, the crystal growth of the second composition layer 32 progresses with strain energy held therein.

As the growth advances, energy instability increases. Therefore, a misfit dislocation is gradually introduced in the second composition layer 32, for releasing the strain energy. Then, upon reaching a certain critical state, the strain energy held in the second composition layer 32 is fully released. At this time, a state of $a=a_0$ is created as shown in FIG. 2C.

However, if the formation of the second composition layer 32 is terminated in a state of $a_0>a$ as shown in FIG. 2B prior to reaching the state shown in FIG. 2C, the second composition layer 32 remains holding the strain energy (remains containing the compressive strain). In this embodiment, such a crystal growth with the strain energy contained therein is referred to as a crystal growth in a coherent state. In other words, the second composition layer 32 is in the coherent state relative to the first composition layer 31 as long as the second composition layer 32 is formed with a thickness smaller than a critical film thickness at which the strain energy is fully released. Alternatively, in still other words, the second composition layer 32 is in the coherent state relative to the first composition layer 31 as long as the lattice length a of the uppermost surface of the second composition layer 32 (the surface that will be in contact with the first composition layer 31 located immediately above) satisfies $a_0>a$. Even if $a_0=a$ is created partially in the second composition layer 32, it can be said that the second composition layer 32 is in the coherent state relative to the first composition layer 31, as long as the second composition layer 32 contains the strain energy in the above-described manner.

The in-plane lattice constant of AlN of the first composition layer 31 is smaller than the in-plane lattice constant of $Al_xGa_{1-x}N$ of the second composition layer 32. Therefore, even when the first composition layer 31 is formed on the second composition layer 32 with the strain energy held therein, the coherent state is maintained, not causing a release of the strain energy held in the second composition layer 32 located immediately below. Then, if the second composition layer 32 is again grown on this first composition layer 31 so as to make the coherent state, the same compressive strain as described above is also caused in this second composition layer 32, too.

Subsequently, in the same manner, the formation of the first composition layer 31 and the second composition layer 32 is alternately repeated while maintaining the growth in the coherent state. Thereby, the strain energy is held in each of the second composition layers 32. Moreover, in this embodiment, the composition modulation layer 3 is formed such that the (Expression 1) and (Expression 2) are satisfied, in other words, such that the second composition layer 32<i> more distant from the base substrate 1 has a lower Al mole fraction x(i). Therefore, the difference between the in-plane lattice constant of $Al_xGa_{1-x}N$ of the second composition layer 32 and the in-plane lattice constant of AlN of the first composition layers 31 that interpose the second composition layer 32 therebetween increases in a portion more distant from the base substrate 1. As a result, as the second composition layer 32 is formed-upper, a larger compressive strain is contained therein. Accordingly, the composition modulation layer 3 can be considered as a strain-introduced layer configured such that a portion thereof located more distant from the base substrate 1 has a larger compressive strain contained therein. Such an introduction of the compressive strain into the composition modulation layer 3 is suitably achieved in a case where the relationship of $x(1) \geq 0.8$ and $x(n) \leq 0.2$ is satisfied.

This compressive strain acts in a direction exactly opposite to the direction of the tensile stress that is caused by a difference in the thermal expansion coefficient, and therefore functions to cancel the tensile stress at the time of temperature drop. In outline, the tensile stress is cancelled by a force that is proportional to the total sum of the magnitudes of the compressive strains contained in the n second composition layers 32.

The first composition layer 31 is interposed between the two second composition layers 32. The first composition layer 31 having too small a thickness is not preferable, because this reduces the compressive strain occurring in the second composition layer 32, and rather, the tensile stress is likely to exist in the first composition layer 31 itself. On the other hand, too large a thickness is not preferable, either, because the second composition layer 32 itself is likely to receive a force in a tensile direction. The above-mentioned requirement that the thickness is about 3 to 20 nm is preferable in terms of not causing such failures.

(Termination Layer)

The termination layer 4 is formed in the uppermost portion of the composition modulation layer 3, and made of a group-III nitride having the same composition as that of the first composition layer 31, that is, a group-III nitride whose in-plane lattice constant is smaller than that of the group-III nitride of the second composition layer 32. The termination layer 4 is formed with a thickness greater than the thickness of the first composition layer 31. Presence of the termination layer 4 in such a manner enables the compressive strain introduced in the composition modulation layer 3 to be suitably maintained even in a case where the first intermediate layer 5 is provided in a later-described manner.

However, in a case where the thickness of the termination layer 4 is too large, a lattice constant thereof approaches the bulk state, and therefore lattice relaxation is caused in the first intermediate layer 5 formed thereon. In such a case, the first intermediate layer 5, which is provided originally in order to function as a strain reinforcing layer as described later, does not exert its functions and effects. It is not preferable. On the other hand, in a case where the thickness of the termination layer 4 is too small, it is likely that a tensile stress exists in the termination layer 4, similarly to the first composition layer 31 interposed between the two second composition layers 32. It is not preferable. The above-mentioned requirement that the thickness is equal to or greater than the thickness of the first composition layer 31, and the requirement that the thickness is about 3 to 100 nm, are preferable in terms of not causing such failures.

In a case where the thickness of the termination layer 4 is greater than the thickness of the first composition layer 31, warping of the epitaxial substrate 10 is more effectively reduced. This manner is preferable particularly to obtain the epitaxial substrate 10 having a high breakdown voltage and suppressed warping.

(First Intermediate Layer)

The first intermediate layer 5 is formed on the termination layer 4 and made of a group-III nitride having a composition of $Al_yGa_{1-y}N$ ($0 \leq y < 1$) whose in-plane lattice constant under the strain-free state is greater than that of the group-III nitride of the termination layer 4. The first intermediate layer 5 is formed so as to be in the coherent state relative to the termination layer 4 and formed on the composition modulation layer 3 containing the strain that becomes larger in an upper portion. Accordingly, the first intermediate layer 5 itself contains a large compressive strain. As a result, in the buffer layer 8, the first intermediate layer 5 functions as a strain reinforcing layer for enhancing the compressive strain introduced into the composition modulation layer 3. Providing such a first intermediate layer 5 can more effectively cancel the tensile stress in the epitaxial substrate 10.

When the thickness of the first intermediate layer 5 becomes too large, the amount of warping in the epitaxial substrate 10 increases. This is because, as the crystal grows, an accumulation of the strain energy reaches a limit so that the compressive strain is weakened and it becomes difficult for the lattice to grow while kept in the coherent state, and eventually the critical film thickness is exceeded to consequently release the strain energy. Such increase in the amount of warping is a factor that causes cracking. To be specific, when the thickness of the first intermediate layer 5 exceeds 500 nm, the amount of warping becomes larger than when the first intermediate layer 5 is not provided. When the thickness of the first intermediate layer 5 is less than 100 nm, the strain reinforcing effect obtained by the first intermediate layer 5 cannot be sufficiently exerted. Consequently, when the thickness of the first intermediate layer 5 is 100 nm or more and 300 nm or less, the compressive strain in the buffer layer 8 is suitably enhanced.

(Second Intermediate Layer)

As a result of forming the composition modulation layer 3, the termination layer 4, and the first intermediate layer 5 in the above-described manner, the compressive strain exists in the entire unit structure 6. Therefore, it is supposed that a large compressive strain sufficient for preventing occurrence of cracking should be obtained by laminating a plurality of the unit structures 6. However, actually, even though one unit structure 6 is formed immediately on another unit structure 6, a sufficient compressive strain cannot be obtained in the upper unit structure 6, for the following reasons. The group-III nitride of the first intermediate layer 5 that is the uppermost layer of the lower unit structure 6 has an in-plane lattice constant, under the strain-free state, greater than that of the group-III nitride of the first composition layer 31 that is the lowermost layer of the upper unit structure 6. Additionally, the first composition layer 31 is formed with a thickness of only about 3 to 20 nm. Accordingly, if the first composition layer 31 is formed directly on the first intermediate layer 5, a tensile strain exists in the first composition layer 31, and thus a sufficient compressive strain cannot be introduced in the composition modulation layer 3.

Therefore, in this embodiment, the second intermediate layer 7 is provided between the unit structures 6, thereby preventing occurrence of the above-described failures involved in the introduction of the tensile strain, and causing a sufficient compressive strain to exist in each individual unit structure 6.

To be specific, on the first intermediate layer 5 that is the uppermost layer of the unit structure 6, the second intermediate layer 7 made of a group-III nitride whose in-plane lattice constant under the strain-free state is smaller than the group-III nitride of the first intermediate layer 5 is formed. In the second intermediate layer 7 provided in this manner, a misfit dislocation caused by a difference in the lattice constant from the first intermediate layer 5 exists in the vicinity of an interface with the first intermediate layer 5, but a lattice relaxation occurs at least in the vicinity of the surface thereof, to achieve a substantially strain-free state in which no tensile stress acts. Here, being substantially strain-free means that at least a portion other than the vicinity of the interface with the first intermediate layer 5 immediately below has the substantially same lattice constant as the lattice constant under the bulk state.

In the unit structure 6 formed on such a substantially strain-free second intermediate layer 7, no tensile stress acts on the first composition layer 31 that is the lowermost layer of this unit structure 6. Therefore, this unit structure 6 is also formed in such a manner that a compressive strain suitably exists therein, similarly to the unit structure 6 immediately below the second intermediate layer 7.

Preferably, the second intermediate layer 7, similarly to the first composition layer 31, is made of AlN. In this case, by continuously forming the second intermediate layer 7 and the first composition layer 31, both of them are configured as substantially one layer. This can more surely prevent a tensile stress from acting on the first composition layer 31.

Here, in order to suppress occurrence of cracking in the epitaxial substrate 10, it is necessary that the second intermediate layer 7 is formed with a thickness of 10 nm or more and 150 nm or less. In a case where the thickness of the second intermediate layer 7 is less than 10 nm, a tensile stress acts on the second intermediate layer 7 similarly to a case where the first composition layer 31<1> is formed directly on the first intermediate layer 5, and the composition modulation layer 3 is formed under an influence thereof. As a result, a compressive strain does not suitably exist in the composition modulation layer 3. It is not preferable. On the other hand, in a case where the thickness of the second intermediate layer 7 is more than 150 nm, an influence of a difference in the thermal expansion coefficient between the second intermediate layer 7 itself and silicon of the base substrate 1 is not negligible, and a tensile stress caused by the difference in the thermal expansion coefficient acts on the second intermediate layer 7. It is not preferable. In either case, cracking occurs in the epitaxial substrate 10. Forming the second intermediate layer 7 with a thickness of 10 nm or more and 150 nm or less enables the second intermediate layer 7 to be in a substantially strain-free state, so that a state where no tensile stress acts on the first composition layer 31<1> located immediately above is created. As a result, the crack-free epitaxial substrate 10 is achieved.

In a case of providing more unit structures 6, the second intermediate layer 7 is interposed between ones of the unit structures 6 in the same manner as described above, to thereby achieve a state where a compressive strain suitably exists in all the unit structures 6.

In the epitaxial substrate 10 including the buffer layer 8 configured in the above-described manner, due to the large compressive strain existing in the buffer layer 8, a state is achieved in which a tensile stress caused by a difference in the thermal expansion coefficient between silicon and the group-III nitride is suitably cancelled. Thereby, in the epitaxial substrate 10, a crack-free state is achieved and the amount of warping is suppressed to 100 μm or less.

The above-mentioned requirements that the value of n, which represents the number of laminations of the first composition layer 31 and the second composition layer 32, is about 40 to 100, that the number of laminations of the unit structure 6 is about 3 to 6, and that the relationship of $x(1) \geq 0.8$ and $x(n) \leq 0.2$ is satisfied, are preferable in terms of providing a sufficient amount of compressive strain in the buffer layer 8 to thereby cancel the tensile stress caused by the difference in the thermal expansion coefficient.

That is, in the epitaxial substrate 10 according to this embodiment, the buffer layer 8 is provided by alternately laminating the unit structure 6, in which the termination layer 4 and the first intermediate layer 5 serving as a strain reinforcing layer are formed on the composition modulation layer 3 serving as a strain introduction layer, and the substantially strain-free second intermediate layer 7. This causes a large compressive strain to exist in the buffer layer 8, to suitably reduce a tensile stress caused in the epitaxial substrate 10 due to the difference in the thermal expansion coefficient between silicon and the group-III nitride. As a result, in the epitaxial substrate 10, a crack-free state is achieved and warping is reduced.

Since the buffer layer 8 is formed on the second base layer 2b in which an accumulation of strain energy is suppressed as described above, the effect of canceling the tensile stress is not hindered by any strain energy accumulated in the second base layer 2b.

Moreover, repeatedly laminating the unit structure 6 and the second intermediate layer 7 increases the total film thickness of the epitaxial film itself. In general, in a case where a HEMT device is prepared using the epitaxial substrate 10, as the total film thickness thereof increases, the breakdown voltage of the HEMT device becomes higher. Thus, the configuration of the epitaxial substrate 10 according to this embodiment also contributes to increase of the breakdown voltage.

<Increase of Breakdown Voltage of Epitaxial Substrate>

The epitaxial substrate 10 according to this embodiment is also characterized by high breakdown voltage properties because of providing of the buffer layer 8 (and more specifically the unit structures 6) having the above-described configuration.

For example, in the epitaxial substrate 10 in which the composition modulation layer 3 is formed so as to satisfy the relationship of $x(1) \div 0.8$ and $x(n) \leq 0.2$ and in which the total film thickness of the entire epitaxial film except the base substrate 1 is 4.0 μm or less, a high breakdown voltage of 600V or more is achieved. For the achievement of such a high breakdown voltage, it is not essential to provide the second intermediate layer 7 in the epitaxial substrate 10. However, as described above, forming the second intermediate layer 7 with a thickness of 10 nm or more and 150 nm or less enables the crack-free epitaxial substrate 10 having an increased breakdown voltage to be obtained. In this embodiment, the breakdown voltage means a voltage value at which a leakage current of 1 mA/cm² occurs in a case where the voltage is applied to the epitaxial substrate 10 while being increased from 0V.

In a case where the first intermediate layer 5 is made of a group-III nitride having a composition of $Al_yGa_{1-y}N$ ($0.25 \leq y \leq 0.4$), the epitaxial substrate 10 having a further higher breakdown voltage of 900V or higher is achieved. Alternatively, the epitaxial substrate 10 having a higher breakdown voltage can also be obtained by appropriately setting the number of repetitions of lamination of the composition modulation layers 3, the total film thickness of the entire epitaxial film, and the total film thickness of the second composition layers 32. For example, an epitaxial substrate in which the total film thickness of the entire epitaxial film is 5 µm and the breakdown voltage is 1000V or higher, and an epitaxial substrate in which the total film thickness of the entire epitaxial film is 7 µm and the breakdown voltage is 1400V or higher, can be achieved.

Additionally, in a case where the thickness of the termination layer 4 is greater than the thickness of the first composition layer 31, an epitaxial substrate in which the breakdown voltage is high and warping is suitably suppressed is achieved.

As described above, in this embodiment, the buffer layer formed by alternately laminating the unit structure, which includes the composition modulation layer and the first intermediate layer, and the substantially strain-free second intermediate layer is provided between the base substrate and the function layer, the composition modulation layer being formed by the first composition layer and the second composition layer being alternately laminated in such a manner that the Al mole fraction in the second composition layer decreases in an upper portion. Accordingly, an epitaxial substrate having an increased breakdown voltage can be obtained in which a silicon substrate, which is easily available in a large diameter at a low cost, is adopted as a base substrate thereof.

Moreover, since the second intermediate layer is formed with a thickness of 10 nm or more and 150 nm or less, a crack-free epitaxial substrate having a high breakdown voltage in which the amount of warping is reduced to about 60 µm to 70 µm is achieved.

<Modification>

In the epitaxial substrate 10, an interface layer (not shown) may be provided between the base substrate 1 and the first base layer 2a. In one preferable example, the interface layer has a thickness of about several inn and is made of amorphous $SiAl_uO_vN_w$.

In a case where an interface layer is provided between the base substrate 1 and the first base layer 2a, a lattice misfit between the base substrate 1 and the second base layer 2b, and the like, is more effectively relieved, and the crystal quality of each layer formed thereon is further improved. That is, in a case where an interface layer is provided, an AlN layer that is the first base layer 2a is formed such that the AlN layer has a concavo-convex shape similar to a case where no interface layer is provided and such that the amount of crystal grain boundaries existing therein is reduced as compared with the case where no interface layer is provided. Particularly, the first base layer 2a having improvement in the half width value of the (0002) X-ray rocking curve is obtained. This is because, in a case where the first base layer 2a is formed on the interface layer, nucleus formation of AlN, which will make the first base layer 2a, is less likely to progress than in a case where the first base layer 2a is formed directly on the base substrate 1, and consequently the growth in the horizontal direction is promoted as compared with when no interface layer is provided. The film thickness of the interface layer is to an extent not exceeding 5 nm. In a case where such an interface layer is provided, the first base layer 2a is formed such that the half width of the (0002) X-ray rocking curve can be in a range of 0.5 degrees or more and 0.8 degrees or less. In this case, the function layer 9 can be formed with a more excellent crystal quality in which the half width of the (0002) X-ray rocking curve is 800 sec or less and the screw dislocation density is $1\times10^9/cm^2$ or less.

The formation of the interface layer is achieved by, after the silicon wafer reaches the first base layer formation temperature and before the first base layer 2a is formed, introducing only an TMA bubbling gas into the reactor to expose the wafer to an TMA bubbling gas atmosphere.

Furthermore, in the formation of the first base layer 2a, at least one of Si atoms and O atoms may diffuse and form a solid solution in the first base layer 2a, or at least one of N atoms and O atoms may diffuse and form a solid solution in the base substrate 1.

Layer configurations (such as a manner of giving the compositional grading) of the composition modulation layers 3 included in the buffer layer 8 should not necessarily be the same, but may be different from one another.

EXAMPLES

As an example, a plurality of types of epitaxial substrates 10 were prepared, which were different from one another in terms of the layer configuration of the buffer layer 8. Table 1 shows a basic configuration of the epitaxial substrates 10 according to the example, and more specifically, materials for forming the respective layers and the film thicknesses of the respective layers.

TABLE 1

| | Name | | Material | Film Thickness | |
|---|---|---|---|---|---|
| | Function layer | Barrier layer | $Al_{0.2}Ga_{0.8}N$ | 25 nm | Repeated K times |
| | | Channel layer | GaN | 700 nm | |
| Unit structure | First intermediate layer | | $Al_yGa_{1-y}N$ | D nm | |
| | Termination layer | | AlN | C nm | |
| | Composition modulation layer | Second composition layer | $Al_xGa_{1-x}N$ | B nm | (A + B) × n nm |
| | | First composition layer | AlN | A nm | |
| | Second intermediate layer | | AlN | E nm | |
| Unit structure | First intermediate layer | | $Al_yGa_{1-y}N$ | D nm | |
| | Termination layer | | AlN | C nm | |
| | Composition modulation layer | Second composition layer | $Al_xGa_{1-x}N$ | B nm | (A + B) × n nm |
| | | First composition layer | AlN | A nm | |

TABLE 1-continued

| | | | | |
|---|---|---|---|---|
| Unit structure | First intermediate layer | $Al_yGa_{1-y}N$ | D nm | |
| | Termination layer | AlN | C nm | |
| | Composition modulation layer — Second composition layer | $Al_xGa_{1-x}N$ | B nm | $(A+B) \times n$ nm |
| | First composition layer | AlN | A nm | |
| | Second intermediate layer | AlN | E nm | |
| Unit structure | First intermediate layer | $Al_yGa_{1-y}N$ | D nm | |
| | Termination layer | AlN | C nm | |
| | Composition modulation layer — Second composition layer | $Al_xGa_{1-x}N$ | B nm | $(A+B) \times n$ nm |
| | First composition layer | AlN | A nm | |
| | Second base layer/First base layer | $Al_{0.1}Ga_{0.9}N$/AlN | 140 nm | |
| | Base substrate | Si(111) | 525 nm | |

As shown in Table 1, in this example, the materials and the film thicknesses of the base substrate 1, the base layer 2 (the first base layer 2a and the second base layer 2b), and the function layer 9 were the same for all the epitaxial substrates 10. The function layer 9 was configured as two layers of the channel layer and the barrier layer.

Any of the first composition layer 31, the termination layer 4, and the second intermediate layer 7 was made of AlN, but the film thicknesses thereof was varied depending on specimens. In Table 1, the film thickness of the first composition layer 31 is represented as the variable A (nm), the film thickness of the termination layer 4 is represented as the variable C (nm), and the film thickness of the second intermediate layer 7 is represented as the variable E (nm). In the same manner, the film thickness of the second composition layer 32 is represented as the variable B (nm), and the film thickness of the first intermediate layer 5 is represented as the variable D (nm). n represents the number of each of the first composition layer 31 and the second composition layer 32. K represents the number of repetitions of the unit structures 6.

Example 1

In this example, the values of B, D, E, n, and K, and the compositional grading, were variously changed. Thereby, 23 types of epitaxial substrates 10 (specimens No. 1 to No. 19, and No. 28 to No. 31) in total were prepared. In any specimen, A=C=5 nm was satisfied.

As a comparative example, eight types of epitaxial substrates 10 (specimens No. 20 to No. 27) were prepared in each of which only one composition modulation layer 3 having the constant Al mole fraction through all the second composition layers 32 is provided and neither of the first intermediate layer 5 nor the second intermediate layer 7 is provided. In the comparative example, the same preparation conditions as those of the example were adopted, except for the second composition layer 32.

Table 2 shows, with respect to each specimen, the values of A(C), B, D, E, n, and K, the value of the Al mole fraction x(i) in the i-th one of the second composition layers 32 as counted from the base substrate 1 side, the value of the Al mole fraction y in the first intermediate layer 5, the total thickness of the composition modulation layers 3, and the total thickness of the epitaxial film.

TABLE 2

| | Specimen No. | A (nm) | B (nm) | D (nm) | E (nm) | n | K | x(i) | y | Thickness of Unit Structure (nm) | Total Thickness of Composition Modulation Layer (nm) | Total Thickness of Epitaxial Film (nm) |
|---|---|---|---|---|---|---|---|---|---|---|---|---|
| Example | 1 | 5 | 15 | 120 | 25 | 30 | 3 | $1 - (i/n)$ | 0 | 725 | 2225 | 3090 |
| | 2 | 5 | 15 | 180 | 25 | 30 | 3 | | 0 | 785 | 2405 | 3275 |
| | 3 | 5 | 15 | 300 | 25 | 20 | 3 | | 0 | 705 | 2165 | 3035 |
| | 4 | 5 | 15 | 120 | 25 | 20 | 4 | | 0 | 525 | 2175 | 3045 |
| | 5 | 5 | 15 | 300 | 25 | 14 | 4 | | 0 | 585 | 2415 | 3285 |
| | 6 | 5 | 15 | 120 | 15 | 15 | 5 | | 0 | 425 | 2185 | 3055 |
| | 7 | 5 | 15 | 120 | 15 | 12 | 6 | | 0 | 365 | 2265 | 3135 |
| | 8 | 5 | 15 | 180 | 60 | 18 | 4 | | 0 | 545 | 2360 | 3230 |
| | 9 | 5 | 15 | 180 | 140 | 16 | 4 | | 0 | 505 | 2440 | 3310 |
| | 10 | 5 | 15 | 120 | 25 | 20 | 4 | | 0.25 | 525 | 2175 | 3045 |
| | 11 | 5 | 15 | 120 | 25 | 20 | 4 | | 0.4 | 525 | 2175 | 3045 |
| | 12 | 5 | 15 | 300 | 25 | 14 | 4 | | 0.25 | 585 | 2415 | 3285 |
| | 13 | 5 | 15 | 300 | 25 | 14 | 4 | | 0.4 | 585 | 2415 | 3285 |
| | 14 | 5 | 15 | 120 | 25 | 20 | 4 | $1 - 0.06 \times i$ (i = 1 to 10)<br>$0.8 - 0.04 \times i$ (i = 11 to 20) | 0 | 525 | 2175 | 3045 |

TABLE 2-continued

| | Specimen No. | A (nm) | B (nm) | D (nm) | E (nm) | n | K | x(i) | y | Thickness of Unit Structure (nm) | Total Thickness of Composition Modulation Layer (nm) | Total Thickness of Epitaxial Film (nm) |
|---|---|---|---|---|---|---|---|---|---|---|---|---|
| | 15 | 5 | 15 | 120 | 25 | 20 | 4 | 1 − 0.04 × i (i = 1 to 10)<br>1.2 − 0.06 × i (i = 11 to 20) | 0 | 525 | 2175 | 3045 |
| | 16 | 5 | 15 | 120 | 25 | 20 | 4 | 1 − 0.08 × i (i = 1 to 5)<br>0.7 − 0.02 × i (i = 6 to 15)<br>1.6 − 0.08 × i (i = 16 to 20) | 0 | 525 | 2175 | 3045 |
| | 17 | 5 | 15 | 120 | 25 | 20 | 4 | 1 − 0.02 × i (i = 1 to 5)<br>1.3 − 0.08 × i (i = 6 to 15)<br>0.4 − 0.02 × i (i = 16 to 20) | 0 | 525 | 2175 | 3045 |
| | 18 | 5 | 15 | 120 | 25 | 20 | 4 | 0.8 (i = 1 to 5)<br>0.6 (i = 6 to 10)<br>0.4 (i = 11 to 15)<br>0.2 (i = 16 to 20) | 0 | 525 | 2175 | 3045 |
| | 19 | 5 | 15 | 120 | 25 | 18 | 4 | 0.9 (i = 1 to 2)<br>0.8 (i = 3 to 4)<br>0.7 (i = 5 to 6)<br>0.6 (i = 7 to 8)<br>0.5 (i = 9 to 10)<br>0.4 (i = 11 to 12)<br>0.3 (i = 13 to 14)<br>0.2 (i = 15 to 16)<br>0.1 (i = 17 to 18) | 0 | 485 | 2015 | 2885 |
| Comparative Example | 20 | 5 | 15 | — | — | 100 | 1 | 0 | — | 2005 | 2005 | 2875 |
| | 21 | 5 | 20 | — | — | 80 | 1 | 0 | — | 2005 | 2005 | 2875 |
| | 22 | 5 | 25 | — | — | 70 | 1 | 0 | — | 2105 | 2105 | 2975 |
| | 23 | 5 | 35 | — | — | 50 | 1 | 0 | — | 2005 | 2005 | 2875 |
| | 24 | 5 | 15 | — | — | 100 | 1 | 0.1 | — | 2005 | 2005 | 2875 |
| | 25 | 5 | 15 | — | — | 100 | 1 | 0.2 | — | 2005 | 2005 | 2875 |
| | 26 | 5 | 15 | — | — | 100 | 1 | 0.3 | — | 2005 | 2005 | 2875 |
| | 27 | 5 | 15 | — | — | 100 | 1 | 0.4 | — | 2005 | 2005 | 2875 |
| Example | 28 | 5 | 15 | 120 | — | 20 | 4 | 1 − (i/n) | 0 | 525 | 2100 | 2970 |
| | 29 | 5 | 15 | 120 | 200 | 20 | 4 | | 0 | 525 | 2700 | 3570 |
| | 30 | 5 | 25 | 120 | — | 20 | 3 | | 0 | 725 | 2175 | 3045 |
| | 31 | 5 | 25 | 120 | 200 | 20 | 3 | | 0 | 725 | 2575 | 3445 |

A specific process for preparing each of the epitaxial substrates 10 is as follows.

Firstly, until the formation of the second base layer 2b, the same procedure was performed for any of the specimens. A (111) plane single crystal silicon wafer (hereinafter, a silicon wafer) of four inches having the p-type conductivity and having a substrate thickness of 525 μm was prepared as the base substrate 1. The prepared silicon wafer was subjected to dilute hydrofluoric acid cleaning using dilute hydrofluoric acid having a composition of hydrofluoric-acid/pure-water=1/10 (volume ratio), and subjected to SPM cleaning using cleaning liquid having a composition of sulfuric-acid/aqueous-hydrogen-peroxide=1/1 (volume ratio). Thus, a state was created in which an oxide film having a thickness of several Å was formed on the wafer surface, which was then set in a reactor of a MOCVD apparatus. Then, a hydrogen/nitrogen mixed atmosphere was created in the reactor, and the pressure in the reactor was set to be 15 kPa. Heating was performed until the substrate temperature reached 1100° C. that is the first base layer formation temperature.

When the substrate temperature reached 1100° C., a $NH_3$ gas was introduced into the reactor, and the substrate surface was exposed to a $NH_3$ gas atmosphere for one minute.

Then, a TMA bubbling gas was introduced into the reactor with a predetermined flow ratio, to react $NH_3$ with TMA, so that the first base layer 2a whose surface has a three-dimensional concavo-convex shape was formed. At this time, the growing speed (film formation speed) of the first base layer 2a was set to be 20 nm/min, and the target average film thickness of the first base layer 2a was set to be 100 nm.

After the first base layer 2a was formed, then the substrate temperature was set to be 1100° C. and the pressure in the reactor was set to be 15 kPa. A TMG bubbling gas was further introduced into the reactor, to react $NH_3$ with TMA and TMG, so that an $Al_{0.1}Ga_{0.9}N$ layer serving as the second base layer 2b was formed so as to have an average film thickness of about 40 nm.

Subsequent to the formation of the second base layer 2b, the buffer layer 8 was prepared in accordance with the values of A(C), B, D, E, n, K, x(i), and y shown in Table 2. In the formation of the buffer layer 8, the substrate temperature was set to be 1100° C., and the pressure in the reactor was set to be 15 kPa. The same material gas as for the formation of the base layer 2 was used.

The following is an outline of specific set values for A, B, D, E, n, K, and y in the example and the comparative example.

A(C): example (5 nm) comparative example (5 nm);

B: example (15 nm, 25 nm), comparative example (15 nm, 20 nm, 25 nm, 35 nm);

D: example (120 nm, 180 nm, 300 nm), comparative example (not set);

E: example (not set, 15 nm, 25 nm, 60 nm, 140 nm, 200 nm), comparative example (not set);

n: example (12, 14, 15, 16, 18, 20, 30), comparative example (50, 70, 80, 100);

K: example (3, 4, 5, 6), comparative example (1); and y: example (0, 0.25, 0.4), comparative example (not set).

Figure 3:
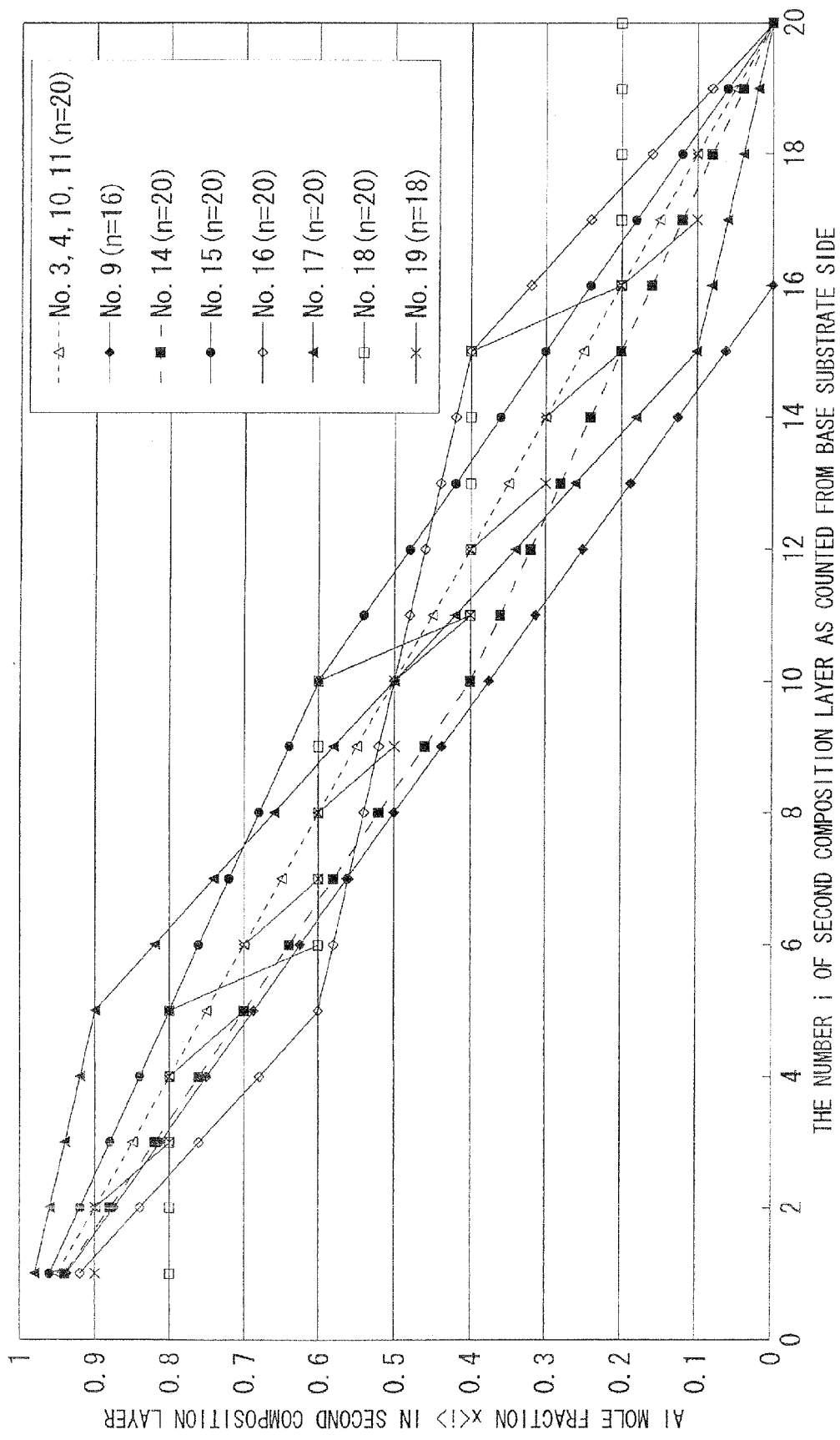
FIG. 3 is a diagram illustrating how the Al mole fraction was changed in main specimens according to an example.

In the specimens according to the example, the compositional grading given to the second composition layer 32, that is, the Al mole fraction x(i) in each second composition layer 32<i> among the second composition layers 32<1> to 32<n>, was broadly classified into the following three manners. FIG. 3 is a diagram illustrating how the Al mole fraction was changed in main specimens. It is to be noted that any specimen was formed so as to satisfy the relationship of $x(1) \geq 0.8$ and $x(n) \leq 0.2$.

Nos. 1 to 13 and Nos. 28 to 31: the Al mole fraction $x(i)$ was monotonically decreased at a constant rate;

Nos. 14 to 17: the Al mole fraction $x(i)$ was monotonically decreased but the rate of change in the course of the decrease was varied; and Nos. 18 to 19: the Al mole fraction $x(i)$ was changed stepwise.

On the other hand, in the specimens according to the comparative example, the value of the Al mole fraction x in the second composition layer 32 was fixedly set to be any of 0, 0.1, 0.2, 0.3, and 0.4.

For any of the specimens according to the example and the comparative example, after the buffer layer 8 was formed, the channel layer made of GaN and serving as the function layer 9 was formed with a thickness of 700 nm, and then the barrier layer made of $Al_{0.2}Ga_{0.8}N$ was further formed with a thickness of 25 nm. In the formation of the function layer 9, the substrate temperature was set to be 1100° C., and the pressure in the reactor was set to be 15 kPa. The same material gas as for the formation of the base layer 2 was used.

Through the above-described process, 31 types of epitaxial substrates 10 were obtained in total.

For the obtained epitaxial substrates 10, the presence or absence of occurrence of cracking was visually checked. Additionally, the amount of warping was measured using a laser displacement gauge. Here, for the epitaxial substrates 10 where cracking occurred, the breakdown voltage was measured in a region not including the cracking. Results of the measurements are shown in Table 3.

As for the breakdown voltage, in the specimens according to the comparative example, even the highest breakdown voltage was below 600V, whereas in all the specimens according to the example, the breakdown voltage was 600V or higher. These results indicate that forming the composition modulation layer 3 so as to give the compositional grading to the second composition layer 32 can provide the epitaxial substrate 10 having a high breakdown voltage. Additionally, it was also confirmed that an epitaxial substrate having a further higher breakdown voltage is obtained when the first intermediate layer is made of a group-III nitride having a composition of $Al_yGa_{1-y}N$ ($0.25 \leq y \leq 0.4$).

As for occurrence of cracking, in all the specimens according to the comparative example, occurrence of cracking was observed at 20 mm from the outer periphery. Among the specimens according to the example, in the specimens Nos. 28 to 31, cracking occurred at 20 mm from the outer periphery. On the other hand, in the specimens Nos. 1 to 19, no cracking was observed irrespective of the manner of giving the compositional grading to the second composition layer 32. That is, among the specimens according to the example, in a case where the second intermediate layer had a thickness of 10 nm or more and 150 nm or less, no cracking occurred, while in a case where the second intermediate layer had a thickness excessively smaller or greater than the above-mentioned range, cracking occurred.

In the specimens where cracking occurred, the amount of warping was at least 135 µm, which largely exceeds 100 µm, while in the specimens according to the example where no cracking occurred, the amount of warping was suppressed to about 60 µm to 70 µm.

The above-described results indicate that providing the buffer layer 8, in which the unit structure having the compressive strain contained therein and the second intermediate layer having a thickness of 10 nm or more and 150 nm or less are alternately laminated, while the unit structure includes the composition modulation layer formed by the first composition layer 31 and the second composition layer 32 being

TABLE 3

| | Specimen No. | Occurrence of Cracking | Warping (µm) | Breakdown Voltage (V) |
|---|---|---|---|---|
| | 1 | Not Observed | 64 | 855 |
| | 2 | Not Observed | 73 | 855 |
| | 3 | Not Observed | 67 | 630 |
| | 4 | Not Observed | 71 | 780 |
| | 5 | Not Observed | 72 | 600 |
| | 6 | Not Observed | 63 | 742.5 |
| | 7 | Not Observed | 68 | 720 |
| | 8 | Not Observed | 70 | 720 |
| | 9 | Not Observed | 71 | 660 |
| | 10 | Not Observed | 63 | 900 |
| | 11 | Not Observed | 67 | 972 |
| | 12 | Not Observed | 75 | 1080 |
| | 13 | Not Observed | 76 | 1260 |
| | 14 | Not Observed | 68 | 780 |
| | 15 | Not Observed | 70 | 780 |
| | 16 | Not Observed | 74 | 780 |
| | 17 | Nol Observed | 69 | 780 |
| | 18 | Not Observed | 66 | 620 |
| | 19 | Not Observed | 65 | 860 |
| Comparative Example | 20 | Occurred at 20 mm from Outer Periphery | 135 | 120 |
| | 21 | Occurred at 20 mm from Outer Periphery | 142 | 145 |
| | 22 | Occurred at 20 mm from Outer Periphery | 156 | 180 |
| | 23 | Occurred at 20 mm from Outer Periphery | 156 | 160 |
| | 24 | Occurred at 20 mm from Outer Periphery | 162 | 350 |
| | 25 | Occurred at 20 mm from Outer Periphery | 163 | 420 |
| | 26 | Occurred at 20 mm from Outer Periphery | 169 | 510 |
| | 27 | Occurred at 20 mm from Outer Periphery | 171 | 590 |
| Example | 28 | Occurred at 20 mm from Outer Periphery | 138 | 700 |
| | 29 | Occurred at 20 mm from Outer Periphery | 156 | 700 |
| | 30 | Occurred at 20 mm from Outer Periphery | 135 | 850 |
| | 31 | Occurred at 20 mm from Outer Periphery | 165 | 850 | alternately laminated in such a manner that the compositional grading is given to the second composition layer 32, the termination layer, and the first intermediate layer, is effective in achieving a crack-free state of the epitaxial substrate 10 and suppression of warping therein.

In the specimens according to the comparative example, the second composition layer has a relatively small thickness, and therefore it would be guessed that the second composition layer itself grew in a coherent state. Despite this, cracking occurred in the comparative example. Accordingly, it is considered that, in a case where, as in the comparative example, the first composition layer and the second composition layer are merely alternately laminated without any compositional grading given to the second composition layer, the compressive strain is introduced into each individual second composition layer 32 but the total sum thereof is not sufficient for canceling the tensile stress.

Example 2

In this example, through the same procedure as in the example 1, nine types of epitaxial substrates 10 were prepared, which corresponded to the specimens Nos. 4, 10, 11, and 14 to 19 according to the example 1 except that the thickness of the termination layer 4 was greater than the thickness of the first composition layer 31. Then, the presence or absence of occurrence of cracking was evaluated, and the amount of warping was measured, and the breakdown voltage was measured. For facilitating the comparison, these specimens are denoted by Nos. 4', 10', 11', and 14' to 19'. As for the thickness of the termination layer 4, three different levels of thickness, namely, 30 nm, 50 nm, and 70 nm, were adopted. In any of the specimens, A=5 nm, B=15 nm, D=120 nm, E=25 nm, and K=4 were satisfied.

Table 4 shows, with respect to each specimen, the values of C and n, the value of the Al mole fraction $x(i)$ in the i-th one of the second composition layers 32 as counted from the base substrate 1 side, the value of the Al mole fraction y in the first intermediate layer 5, the total thickness of the composition modulation layers 3, the total thickness of the epitaxial film, and results of the measurements of the amount of warping and the breakdown voltage.

TABLE 4

| Specimen No. | C (nm) | n | $x(i)$ | y | Thickness of Unit Structure (nm) | Total Thickness of Composition Modulation Layer (nm) | Total Thickness of Epitaxial Film (nm) | Warping (μm) | Breakdown Voltage (V) |
|---|---|---|---|---|---|---|---|---|---|
| 4' | 30 | 20 | $1 - (i/n)$ | 0.4 | 550 | 2275 | 3140 | 61 | 785 |
| 10' | 50 | 20 | | 0.25 | 570 | 2355 | 3220 | 53 | 905 |
| 11' | 70 | 20 | | 0.4 | 590 | 2435 | 3300 | 57 | 965 |
| 14' | 30 | 20 | $1 - 0.06 \times i$ (i = 1 to 10)<br>$0.8 - 0.04 \times i$ (i = 11 to 20) | 0 | 550 | 2275 | 3140 | 58 | 768 |
| 15' | 30 | 20 | $1 - 0.04 \times i$ (i = 1 to 10)<br>$1.2 - 0.06 \times i$ (i = 11 to 20) | 0 | 550 | 2275 | 3140 | 60 | 780 |
| 16' | 30 | 20 | $1 - 0.08 \times i$ (i = 1 to 5)<br>$0.7 - 0.02 \times i$ (i = 6 to 15)<br>$1.6 - 0.08 \times i$ (i = 16 to 20) | 0 | 550 | 2275 | 3140 | 64 | 775 |
| 17' | 30 | 20 | $1 - 0.02 \times i$ (i = 1 to 5)<br>$1.3 - 0.08 \times i$ (i = 6 to 15)<br>$0.4 - 0.02 \times i$ (i = 16 to 20) | 0 | 550 | 2275 | 3140 | 59 | 785 |
| 18' | 30 | 20 | 0.8 (i = 1 to 5)<br>0.6 (i = 6 to 10)<br>0.4 (i = 11 to 15)<br>0.2 (i = 16 to 20) | 0 | 550 | 2275 | 3140 | 56 | 625 |
| 19' | 30 | 18 | 0.9 (i = 1 to 2)<br>0.8 (i = 3 to 4)<br>0.7 (i = 5 to 6)<br>0.6 (i = 7 to 8)<br>0.5 (i = 9 to 10)<br>0.4 (i = 11 to 12)<br>0.3 (i = 13 to 14)<br>0.2 (i = 15 to 16)<br>0.1 (i = 17 to 18) | 0 | 550 | 2275 | 3140 | 55 | 870 |

As shown in Table 4, in any of the specimens Nos. 4', 10', 11', and 14' to 19', the amount of warping was further suppressed as compared with the specimens (Nos. 4, 10, 11, and 14 to 19) according to the example 1 prepared under the same conditions except for the thickness of the termination layer 4. In any of the specimens, no occurrence of cracking was observed. On the other hand, the value of the breakdown voltage was almost similar. These results indicate that the epitaxial substrate 10 in which the amount of warping is further reduced is achieved by forming the termination layer 4 thicker than the first composition layer 31.

The invention claimed is:

1. An epitaxial substrate in which a group of group-III nitride layers are formed on a base substrate made of (111)-oriented single crystal silicon such that a (0001) crystal plane of said group of group-III nitride layers is substantially in parallel with a substrate surface of said base substrate, said epitaxial substrate comprising:
   a buffer layer including a plurality of first lamination units each including a composition modulation layer and a first intermediate layer, said composition modulation layer being formed of a first composition layer made of AlN and a second composition layer made of a group-III nitride having a composition of $Al_xGa_{1-x}N$ ($0 \leq x < 1$) being alternately laminated, said first intermediate layer being made of a group-III nitride having a composition of $Al_yGa_{1-y}N$ ($0 \leq y < 1$); and
   a crystal layer formed on said buffer layer, wherein
each of said composition modulation layers is formed so as to satisfy the relationship of:

$$x(1) \geq x(2) \geq \ldots \geq x(n-1) \geq x(n);$$

and $$x(1) > x(n),$$

where n represents the number of laminations of each of said first composition layer and said second composition layer (n is a natural number equal to or greater than two), and x(i) represents the value of x in i-th one of said second composition layers as counted from said base substrate side,
in each of said composition modulation layers, each of said second composition layers is formed so as to be in a coherent state relative to said first composition layer,
said first intermediate layer is formed so as to be in a coherent state relative to said composition modulation layer.

2. The epitaxial substrate according to claim 1, wherein
said buffer layer is formed of said first lamination unit and a second lamination unit being alternately laminated,
said second lamination unit is a substantially strain-free intermediate layer made of AlN and formed with a thickness of 10 nm or more and 150 nm or less.

3. The epitaxial substrate according to claim 1, wherein
said first intermediate layer is made of a group-III nitride having a composition of $Al_yGa_{1-y}N$ (0.25≤y≤0.4).

4. The epitaxial substrate according to claim 1, wherein
a termination layer having the same composition as that of said first composition layer is provided in an uppermost portion of said composition modulation layer.

5. The epitaxial substrate according to claim 4, wherein
the thickness of said termination layer is greater than the thickness of said first composition layer.

6. A method for manufacturing an epitaxial substrate for use in a semiconductor device, said epitaxial substrate having a group of group-III nitride layers formed on a base substrate made of (111)-oriented single crystal silicon such that a (0001) crystal plane of said group of group-III nitride layers is substantially in parallel with a substrate surface of said base substrate, said method comprising:
a buffer layer formation step for forming a buffer layer including a plurality of first lamination units each including a composition modulation layer and a first intermediate layer, said buffer layer formation step including a plurality of composition modulation layer formation steps and a plurality of first intermediate layer formation steps, said composition modulation layer formation step being a step for forming said composition modulation layer by alternately laminating a first composition layer made of AlN and a second composition layer made of a group-III nitride having a composition of $Al_xGa_{1-x}N$ (0≤x<1), said first intermediate layer formation step being a step for forming said first intermediate layer made of a group-III nitride having a composition of $Al_yGa_{1-y}N$ (0≤y<1); and
a crystal layer formation step for forming a crystal layer above said buffer layer, said crystal layer being made of group-III nitride,
wherein
in said composition modulation layer formation step, said composition modulation layer is formed in such a manner that:

the relationship of:

$$x(1) \geq x(2) \geq \ldots \geq x(n-1) \geq x(n);$$

and $$x(1) > x(n),$$

is satisfied, where n represents the number of laminations of each of said first composition layer and said second composition layer (n is a natural number equal to or greater than two), and x(i) represents the value of x in i-th one of said second composition layers as counted from said base substrate side; and
each of said second composition layers is in a coherent state relative to said first composition layer,
in said first intermediate layer formation step, said first intermediate layer is fog lied so as to be in a coherent state relative to said composition modulation layer.

7. The method for manufacturing the epitaxial substrate according to claim 6, wherein
said buffer layer formation step is a step for forming said buffer layer in which said first lamination unit and a second lamination unit are alternately laminated, by alternately performing a first lamination unit formation step for forming said first lamination unit and a second lamination unit formation step for forming said second lamination unit,
in said second lamination unit formation step, an intermediate layer made of AlN with a thickness of 10 nm or more and 150 nm or less is formed as said second lamination unit.

8. The method for manufacturing the epitaxial substrate according to claim 6, wherein
in said first intermediate layer formation step, said first intermediate layer is formed of a group-III nitride having a composition of $Al_yGa_{1-y}N$ (0.25≤y≤0.4).

9. The method for manufacturing the epitaxial substrate according to claim 6, wherein
said first lamination unit formation step includes a termination layer formation step for forming a termination layer having the same composition as that of said first composition layer in an uppermost portion of said composition modulation layer, and said first intermediate layer is formed on said termination layer.

10. The method for manufacturing the epitaxial substrate according to claim 9, wherein
in said termination layer formation step, said termination layer is formed thicker than said first composition layer.

11. The epitaxial substrate according to claim 2, wherein
said first intermediate layer is made of a group-III nitride having a composition of $Al_yGa_{1-y}N$ (0.25≤y≤0.4).

12. The epitaxial substrate according to claim 2, wherein
a termination layer having the same composition as that of said first composition layer is provided in an uppermost portion of said composition modulation layer.

13. The epitaxial substrate according to claim 12, wherein
the thickness of said termination layer is greater than the thickness of said first composition layer.

14. The method for manufacturing the epitaxial substrate according to claim 7, wherein
in said first intermediate layer formation step, said first intermediate layer is formed of a group-III nitride having a composition of $Al_yGa_{1-y}N$ (0.25≤y≤0.4).

15. The method for manufacturing the epitaxial substrate according to claim 7, wherein
said first lamination unit formation step includes a termination layer formation step for forming a termination layer having the same composition as that of said first composition layer in an uppermost portion of said composition modulation layer, and said first intermediate layer is formed on said termination layer.

16. The method for manufacturing the epitaxial substrate according to claim 15, wherein in said termination layer formation step, said termination layer is formed thicker than said first composition layer.

* * * * *